(12) United States Patent
Yamada et al.

(10) Patent No.: US 7,602,117 B2
(45) Date of Patent: *Oct. 13, 2009

(54) DISPLAY DEVICE AND DISPLAY UNIT USING THE SAME

(75) Inventors: Jiro Yamada, Kanagawa (JP); Nobutoshi Asai, Kanagawa (JP); Shinichiro Tamura, Kanagawa (JP)

(73) Assignee: Sony Corporation, Tokyo (JP)

( * ) Notice: Subject to any disclaimer, the term of this patent is extended or adjusted under 35 U.S.C. 154(b) by 236 days.

This patent is subject to a terminal disclaimer.

(21) Appl. No.: 11/693,906

(22) Filed: Mar. 30, 2007

(65) Prior Publication Data

US 2007/0170852 A1 Jul. 26, 2007

Related U.S. Application Data

(63) Continuation of application No. 10/672,962, filed on Sep. 26, 2003, now Pat. No. 7,224,114.

(30) Foreign Application Priority Data

Oct. 4, 2003 (JP) ............................ P2002-292082

(51) Int. Cl.
  *H01L 51/00* (2006.01)
  *G02B 5/28* (2006.01)
(52) U.S. Cl. ........................ 313/504; 313/506; 313/110; 445/24

(58) Field of Classification Search ................ 313/504, 313/506, 512, 110; 445/24
See application file for complete search history.

(56) References Cited

U.S. PATENT DOCUMENTS

| 7,224,114 B2 * | 5/2007 | Yamada et al. ............... 313/504 |
| 2003/0107314 A1 * | 6/2003 | Urabe et al. ................. 313/506 |

* cited by examiner

*Primary Examiner*—Karabi Guharay
(74) *Attorney, Agent, or Firm*—Sonnenschein Nath & Rosenthal LLP

(57) ABSTRACT

Provided are a display device and a display unit having higher light extraction efficiency. An optical distance $L_1$ between a maximum light-emitting position of a light-emitting layer and a first end portion satisfies $L_1=tL_1+a_1$ and $(2tL_1)/\lambda=-\Phi_1/(2\pi)+m_1$. An optical distance $L_2$ between the maximum light-emitting position and a second end portion satisfies $L_2=tL_2+a_2$ and $(2tL_2)/\lambda=-\Phi_2/(2\pi)+m_2$. In the formulas, $tL_1$ and $tL_2$ represent a theoretical optical distance between the first end portion and the maximum light-emitting position and a theoretical optical distance between the second end portion and the maximum light-emitting position, respectively, $a_1$ and $a_2$ represent correction amounts based upon a light-emitting distribution in the light-emitting layer, $\lambda$ represents a peak wavelength of the spectrum of light desired to be extracted, $\Phi_1$ and $\Phi_2$ represent a phase shift of reflected light generated in the first end portion and a phase shift of reflected light generated in the second end portion, respectively, and each of $m_1$ and $m_2$ is 0 or an integer.

2 Claims, 8 Drawing Sheets

DISPLAY DEVICE AND DISPLAY UNIT USING THE SAME

RELATED APPLICATION DATA AND INCORPORATION BY REFERENCE

This application is a continuation of U.S. patent application Ser. No. 10/672,962, filed Sep. 26, 2003, now U.S. 7,224,114 the entirety of which is incorporated herein by reference to the extent permitted by law. The present application claims priority to Japanese Patent Application No. 2002-292082, filed in the Japanese Patent Office on Oct. 4, 2002, which application is incorporated herein by reference to the extent permitted by law.

BACKGROUND OF THE INVENTION

1. Field of the Invention

The present invention relates to a display device and a display unit using the display device, and more specifically a self-luminous type display device such as an organic light-emitting device and a display unit using the self-luminous type display device.

2. Description of the Related Art

In recent years, organic EL displays using an organic light-emitting device as an alternative to liquid crystal displays have become a focus of attention. The organic EL displays are of a self-luminous type, so it is considered that the organic EL displays have advantages of a wide viewing angle, low power consumption and adequate response to high-definition high-speed video signals. Therefore, the development of the organic EL displays toward commercialization has been proceeding.

Previously, by introducing a resonator structure into the organic light-emitting device, attempts to control light generated in a light-emitting layer such as improving the color purity of an emitted color, enhancing light-emitting efficiency and so on have been made (for example, refer to International Publication No. 01/39554).

However, actual light extraction efficiency in the organic light-emitting device with the resonator structure greatly varies depending upon where a maximum light-emitting position of the light-emitting layer is placed in the resonator structure.

SUMMARY OF THE INVENTION

In view of the foregoing, it is an object of the invention to provide a display device capable of enhancing extraction efficiency of light generated in a light-emitting layer, and a display unit using the display device.

A display device according to the invention comprises: a light-emitting layer between a first electrode and a second electrode; and a resonator structure resonating light generated in the light-emitting layer between a first end portion and a second end portion, wherein an optical distance $L_1$ between the first end portion and a maximum light-emitting position of the light-emitting layer satisfies Mathematical Formula 1, and an optical distance $L_2$ between the second end portion and the maximum light-emitting position of the light-emitting layer satisfies Mathematical Formula 2.

$$L_1 = tL_1 + a_1$$

$$(2tL_1)/\lambda = -\Phi_1/(2\pi) + m_1 \quad \text{[Mathematical Formula 1]}$$

(where $tL_1$ represents a theoretical optical distance between the first end portion and the maximum light-emitting position, $a_1$ represents a correction amount based upon a light-emitting distribution in the light-emitting layer, $\lambda$ represents a peak wavelength of the spectrum of light desired to be extracted, $\Phi_1$ represents a phase shift of reflected light generated in the first end portion, and $m_1$ is 0 or an integer.)

$$L_2 = tL_2 + a_2$$

$$(2tL_2)/\lambda = -\Phi_2/(2\pi) + m_2 \quad \text{[Mathematical Formula 2]}$$

(where $tL_2$ represents a theoretical optical distance between the second end portion and the maximum light-emitting position, $a_2$ represents a correction amount based upon a light-emitting distribution in the light-emitting layer, $\lambda$ represents a peak wavelength of the spectrum of light desired to be extracted, $\Phi_2$ represents a phase shift of reflected light generated in the second end portion, and $m_2$ is 0 or an integer.)

A display unit according to the invention comprises a display device comprising a light-emitting layer between a first electrode and a second electrode, and a resonator structure resonating light generated in the light-emitting layer between a first end portion and a second end portion, wherein an optical distance $L_1$ between the first end portion and a maximum light-emitting position of the light-emitting layer satisfies Mathematical Formula 3, and an optical distance $L_2$ between the second end portion and the maximum light-emitting position of the light-emitting layer satisfies Mathematical Formula 4.

$$L_1 = tL_1 + a_1$$

$$(2tL_1)/\lambda = -\Phi_1/(2\pi) + m_1 \quad \text{[Mathematical Formula 3]}$$

(where $tL_1$ represents a theoretical optical distance between the first end portion and the maximum light-emitting position, $a_1$ represents a correction amount based upon a light-emitting distribution in the light-emitting layer, $\lambda$ represents a peak wavelength of the spectrum of light desired to be extracted, $\Phi_1$ represents a phase shift of reflected light generated in the first end portion, and $m_1$ is 0 or an integer.)

$$L_2 = tL_2 + a_2$$

$$(2tL_2)/\lambda = -\Phi_2/(2\pi) + m_2 \quad \text{[Mathematical Formula 4]}$$

(where $tL_2$ represents a theoretical optical distance between the second end portion and the maximum light-emitting position, $a_2$ represents a correction amount based upon a light-emitting distribution in the light-emitting layer, $\lambda$ represents a peak wavelength of the spectrum of light desired to be extracted, $\Phi_2$ represents a phase shift of reflected light generated in the second end portion, and $m_2$ is 0 or an integer.)

In the display device according to the invention, the optical distance $L_1$ between the first end portion and the maximum light-emitting position satisfies Mathematical Formula 1, and the optical distance $L_2$ between the second end portion and the maximum light-emitting position satisfies Mathematical Formula 2, so when light generated in the light-emitting layer is reflected on the first end portion or the second end portion and is returned to a light-emitting position, the phase of the returned light and the phase of light when the light is emitted are the same as each other. Therefore, the emitted light and the light reflected between the first end portion and the second end portion reinforce each other, so the light generated in the light-emitting layer can be efficiently extracted.

In the display unit according to the invention, the display device according to the invention is used, so the extraction efficiency of light generated in the light-emitting layer can be improved.

Other and further objects, features and advantages of the invention will appear more fully from the following description.

DETAILED DESCRIPTION OF THE PREFERRED EMBODIMENTS

Preferred embodiments of the present invention will be described in more detail below referring to the accompanying drawings.

First Embodiment

Figure 1:
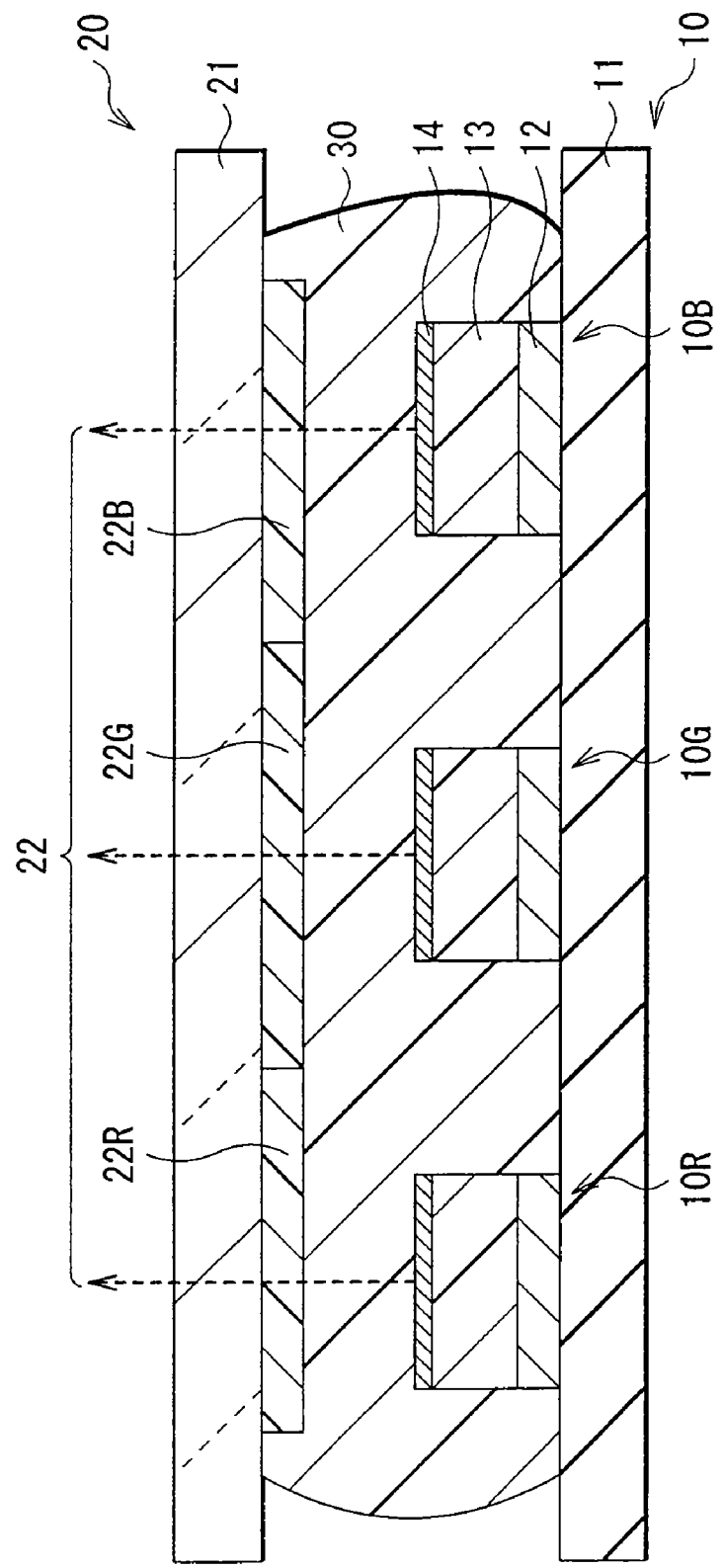
FIG. 1 is a sectional view of a display unit using an organic light-emitting device which is a display device according to a first embodiment of the invention.

FIG. 1 shows a sectional view of a display unit using an organic light-emitting device which is a display device according to a first embodiment of the invention. The display unit is used as an ultra-thin organic light-emitting color display or the like, and in the display unit, for example, a drive panel 10 and a sealing panel 20 faces each other and the whole facing surfaces thereof are bonded together with an adhesive layer 30. The drive panel 10 includes an organic light-emitting device 10R emitting red light, an organic light-emitting device 10G emitting green light and an organic light-emitting device 10B emitting blue light disposed in order in a matrix shape as a whole on a driving substrate 11 made of, for example, an insulating material such as glass or the like.

Each of the organic light-emitting devices 10R, 10G and 10B has a structure in which, for example, a first electrode 12 as an anode, an organic layer 13, and a second electrode 14 as a cathode are laminated in this order from the driving substrate 11.

The first electrode 12 also has a function as a reflective layer, and in order to enhance light-emitting efficiency, it is desirable for the first electrode 12 to have as high reflectance as possible. For example, as a material of the first electrode 12, a single substance or an alloy of a metal element with a high work function such as platinum (Pt), gold (Au), silver (Ag), chromium (Cr), tungsten (W) or the like is cited, and the thickness in a laminating direction (hereinafter simply referred to as thickness) of the first electrode 12 is preferably within a range of 100 nm to 300 nm. As the alloy, for example, a AgPdCu alloy including silver as a main component, 0.3 wt % to 1 wt % of palladium (Pd) and 0.3 wt % and 1 wt % of copper (Cu) is cited.

Figure 2:
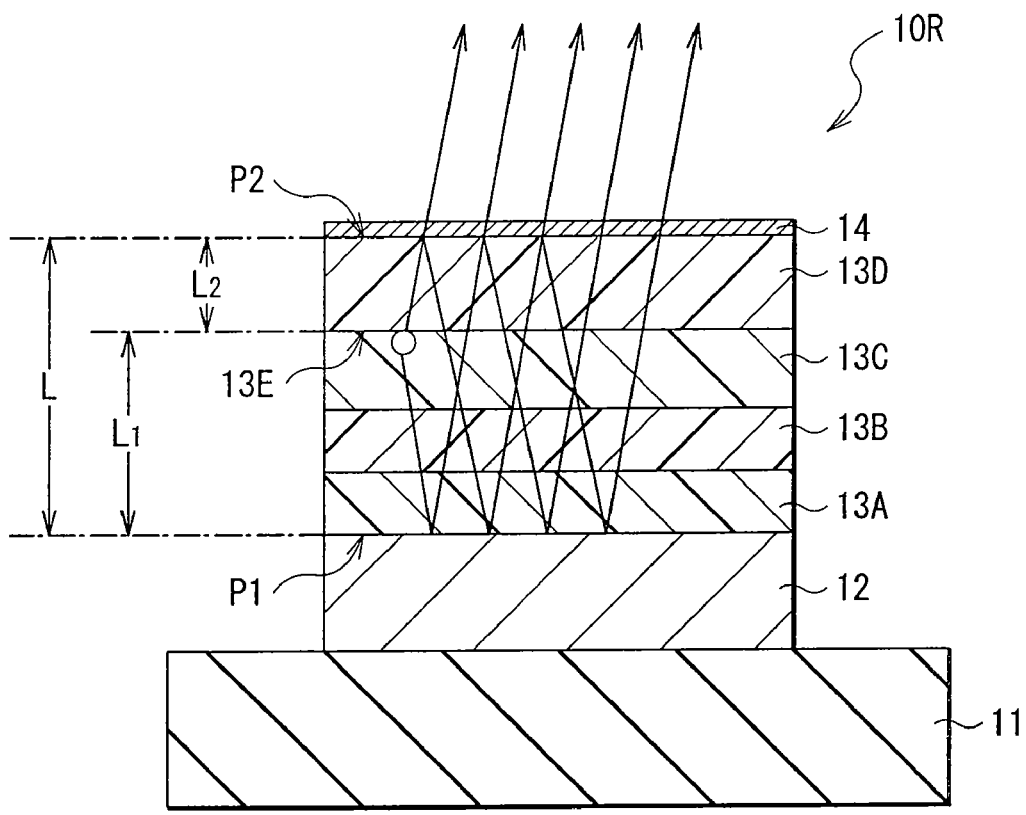
FIG. 2 is an enlarged sectional view of an organic layer in the organic light-emitting device shown in FIG. 1.

The organic layer 13 has a different structure for each of the organic light-emitting devices 10R, 10G and 10B. FIG. 2 shows an enlarged view of the organic layer 13 in the organic light-emitting device 10R. The organic layer 13 of the organic light-emitting device 10R has a structure in which a hole injection layer 13A, a hole transport layer 13B, a light-emitting layer 13C and an electron transport layer 13D are laminated in this order from the first electrode 12. The hole injection layer 13A and the hole transport layer 13B enhance efficiency of hole injection into the light-emitting layer 13C. The light-emitting layer 13C generates light by current injection. The electron transport layer 13D enhances efficiency of electron injection into the light-emitting layer 13C.

The hole injection layer 13A of the organic light-emitting device 10R has, for example, a thickness of 15 nm to 300 nm, and is made of 4,4',4"-tris(3-methylphenylphenylamino)triphenylamine (m-MTDATA) or 4,4',4"-tris(2-naphthylphenylamino)triphenylamine (2-TNATA).

Figure 3:
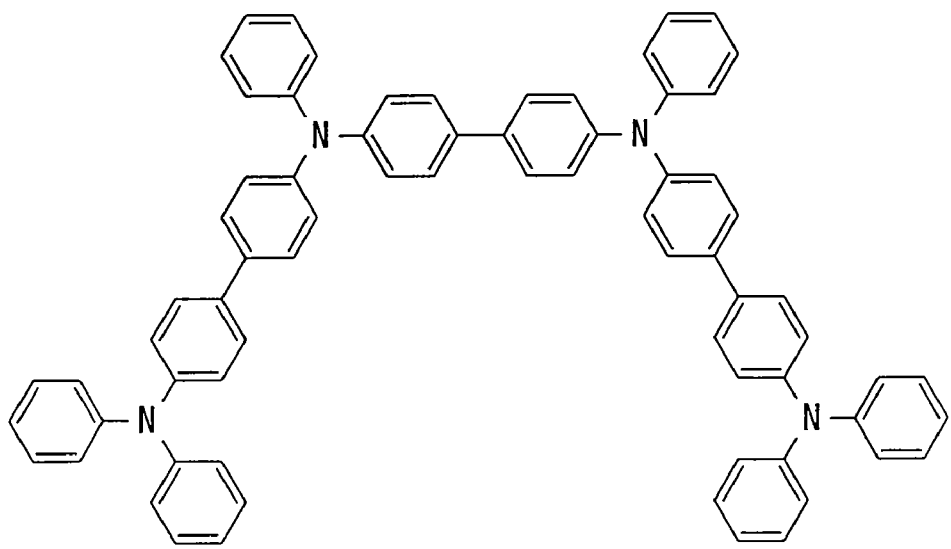
FIG. 3 is an illustration showing the structure of a compound used in the light-emitting layer of the organic light-emitting device shown in FIG. 2.

The hole transport layer 13B of the organic light-emitting device 10R has, for example, a thickness of 15 nm to 100 nm, and is made of bis[(N-naphthyl)-N-phenyl]benzidine (α-NPD) or a compound shown in FIG. 3.

The light-emitting layer 13C of the organic light-emitting device 10R has, for example, a thickness of 15 nm to 100 nm, and is made of 8-quinolinol aluminum complex ($Alq_3$) mixed with 40 vol % of 2,6-bis[4-[N-(4-methoxyphenyl)-N-phenyl]aminostyryl]naphthalene-1,5-dicarbonitrile (BSN-BCN).

The electron transport layer 13D of the organic light-emitting device 10R has, for example, a thickness of 15 nm to 100 nm, and is made of $Alq_3$.

Figure 4:
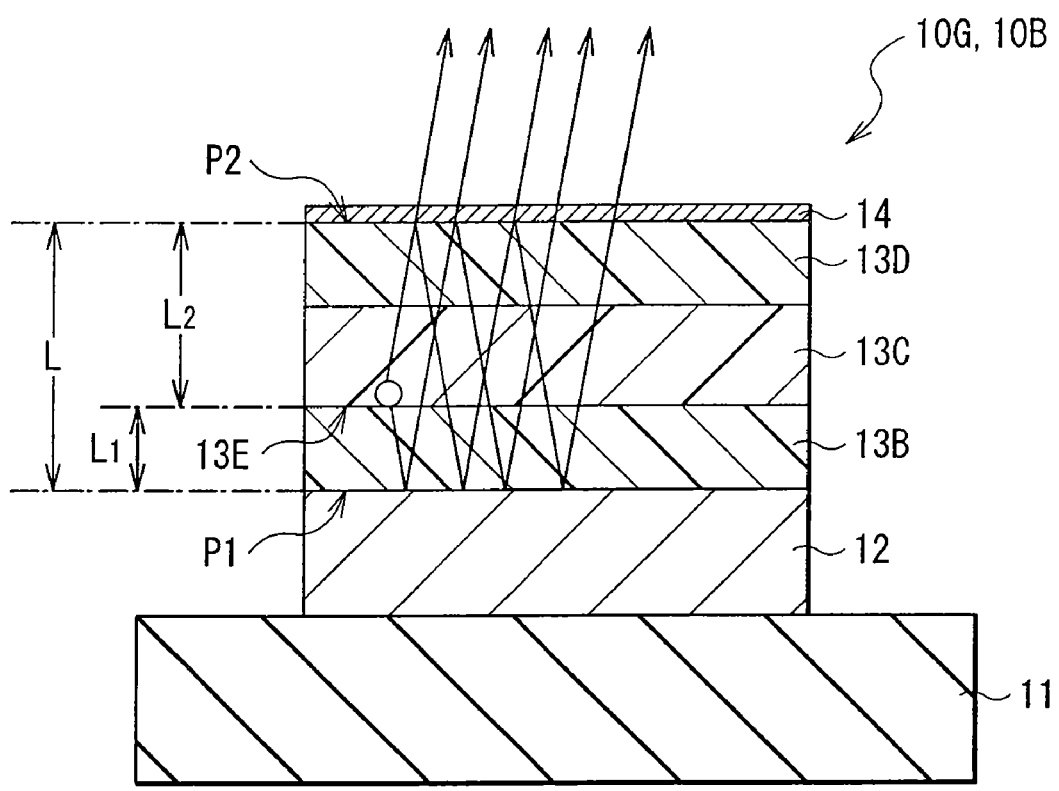
FIG. 4 is an enlarged sectional view of the organic layer in the organic light-emitting device shown in FIG. 1.

FIG. 4 shows an enlarged view of the organic layer 13 in the organic light-emitting devices 10G and 10B. Each of the organic layers 13 of the organic light-emitting devices 10G and 10B has a structure in which the hole transport layer 13B, the light-emitting layer 13C and the electron transport layer 13D are laminated in this order from the first electrode 12. Each of the hole transport layers 13B of the organic light-emitting devices 10G and 10B also has a function as a hole injection layer.

The hole transport layer 13 of the organic light-emitting device 10G has, for example, a thickness of 15 nm to 100 nm, and is made of the compound shown in FIG. 3. The light-emitting layer 13C of the organic light-emitting device 10G has, for example, a thickness of 15 nm to 100 nm, and is made of $Alq_3$ mixed with 3 vol % of Coumarin6. The electron transport layer 13D of the organic light-emitting device 10G has, for example, a thickness of 15 nm to 100 nm, and is made of $Alq_3$.

The hole transport layer 13B of the organic light-emitting device 10B has, for example, a thickness of 15 nm to 100 nm, and is made of the compound shown in FIG. 3. The light-emitting layer 13C of the organic light-emitting device 10B has, for example, a thickness of 15 nm to 100 nm, and is made of spiro6Φ. The electron transport layer 13D of the organic light-emitting device 10B has, for example, a thickness of 15 nm to 100 nm, and is made of $Alq_3$.

The second electrode 14 shown in FIGS. 1, 2 and 4 has, for example, a thickness of 5 nm to 50 nm, and is made of a single substance or an alloy of a metal element with a small work function such as aluminum (Al), magnesium (Mg), calcium (Ca), sodium (Na) or the like. Among them, an alloy of magnesium and silver (MgAg alloy) is preferable, and the volume ratio between magnesium and silver is preferably Mg:Ag=from 5:1 to 30:1.

The second electrode 14 also has a function as a semi-transparent reflective layer. More specifically, the organic light-emitting devices 10R, 10G and 10B have a resonator structure in which a end surface of the first electrode 12 on a side closer to the light-emitting layer 13C, an end surface of the second electrode 14 on a side closer to the light-emitting layer 13C, and the organic layer 13 are regarded as a first end portion P1, a second end portion P2 and a resonant portion, respectively, and light generated in the light-emitting layer 13C is resonated to be extracted from the second end portion P2. Thus, the organic light-emitting devices 10R, 10G and 10B preferably have the resonator structure, because when multiple interference of light generated in the light-emitting layer 13C occurs and the structure functions as a kind of narrow-band filter, the half-value width of the spectrum of extracted light can be reduced and color purity can be improved. Moreover, external light incident from the sealing panel 20 can be attenuated by the multiple interference, and the reflectance of the external light on the organic light-emitting devices 10R, 10G and 10B can become extremely small by a combination of a color filter 22 (refer to FIG. 1) which will be described later.

For the purpose, it is preferable that an optical distance L between the first end portion P1 and the second end portion P2 of the resonator satisfies Mathematical Formula 5 so that a resonant wavelength of the resonator (a peak wavelength of the spectrum of light to be extracted) matches a peak wavelength of the spectrum of light desired to be extracted. Actually, the optical distance L is preferably selected to be a positive minimum value satisfying Mathematical Formula 5.

$$(2L)/\lambda + \Phi/(2\pi) = m \qquad \text{[Mathematical Formula 5]}$$

(where L represents an optical distance between the first end portion P1 and the second end portion P2, $\Phi$ represents the sum of a phase shift $\Phi_1$ of reflected light generated in the first end portion P1 and a phase shift $\Phi_2$ of reflected light generated in the second end portion P2 ($\Phi=\Phi_1+\Phi_2$) (rad), $\lambda$ represents a peak wavelength of the spectrum of light desired to be extracted from the second end portion P2, and m is an integer to make L a positive value. Further, in Mathematical Formula 5, the units of L and $\lambda$ may be the same, for example, (nm).)

Moreover, as shown in FIGS. 2 and 4, the organic light-emitting devices 10R, 10G and 10B are adjusted so that an optical distance $L_1$ between a maximum light-emitting position 13E of the light-emitting layer 13C and the first end portion P1 satisfies Mathematical Formula 6, and an optical distance $L_2$ between the maximum light-emitting position 13E and the second end portion P2 satisfies Mathematical Formula 7. Herein, the maximum light-emitting position 13E means a position where light-emitting intensity is the highest in a light-emitting region. For example, when light is emitted at interfaces of the light-emitting layer 13C on both sides closer to the first electrode 12 and the second electrode 14, the maximum light-emitting position 13E is an interface with higher light-emitting intensity between the interfaces. When the organic light-emitting devices 10R, 10G and 10B are made of the above-described materials, in the organic light-emitting device 10R, light is also emitted at the interface on the side closer to the first electrode, but the light-emitting intensity at the interface on the side closer to the second electrode 14 is higher, so the maximum light-emitting position 13E is the interface on the side closer to the second electrode 14. In the organic light-emitting devices 10G and 10B, light is hardly ever emitted at the interface on the side closer to the second electrode 14, so the maximum light-emitting position 13E is the interface on the side closer to the first electrode 12.

$$L_1 = tL_1 + a_1$$

$$(2tL_1)/\lambda = -\Phi_1/(2\pi) + m_1 \qquad \text{[Mathematical Formula 6]}$$

(where $tL_1$ represents a theortical optical distance between the first end portion P1 and the maximum light-emitting position 13E, $a_1$ represents a correction amount based upon a light-emitting distribution in the light-emitting layer 13C, $\lambda$ represents a peak wavelength of the spectrum of light desired to be extracted, $\Phi_1$ represents a phase shift (rad) of reflected light generated in the first end portion P1, and $m_1$ represents 0 or an integer.)

$$L_2 = tL_2 + a_2$$

$$(2tL_2)/\lambda = -\Phi_2/(2\pi) + m_2 \qquad \text{[Mathematical Formula 7]}$$

(where $tL_2$ represents a theoretical optical distance between the second end portion P2 and the maximum light-emitting position 13E, $a_2$ represents a correction amount based upon a light-emitting distribution in the light-emitting layer 13C, $\lambda$ represents a peak wavelength of the spectrum of light desired to be extracted, $\Phi_2$ represents a phase shift (rad) of reflected light generated in the second end portion P2, $m_2$ is 0 or an integer.)

By satisfying Mathematical Formula 6, when light heading to the first electrode 12 in the light generated in the light-emitting layer 13C is reflected on the first end portion P1 and is returned, the phase of the returned light becomes the same as the phase of the light when the light is emitted, so the returned light and light heading to the second electrode 14 in the emitted light reinforce each other. Further, by satisfying Mathematical Formula 7, when light heading to the second electrode 14 in light generated in the light-emitting layer 13C is reflected on the second end portion P2 and is returned, the phase of the returned light becomes the same as the phase of the light when the light is emitted, so the returned light and light heading to the first electrode 12 in the emitted light reinforces each other.

When it is considered that the light-emitting region is not extended, the theoretical optical distance $tL_1$ in Mathematical Formula 6 and the theoretical optical distance $tL_2$ in Mathematical Formula 7 are theoretical values in which an amount of phase change in the first end portion P1 or the second end portion P2, and an amount of phase change by traveling of light cancel each other out, thereby the phase of the returned light and the phase of the light when the light is emitted become the same as each other. However, a light-emitting portion is generally extended, so in Mathematical Formulas 6 and 7, the correction amounts $a_1$, and $a_2$ based upon the light-emitting distribution are added.

Although the correction amounts $a_1$ and $a_2$ depend upon the light-emitting distribution, as in the case of the embodiment, when the maximum light-emitting position 13E is placed on a side of the light-emitting layer 13C closer to the second electrode 14, and the light-emitting distribution extends from the maximum light-emitting position 13E to the first electrode 12, or when the maximum light-emitting position 13E is placed on a side of the light-emitting layer 13C closer to the first electrode 12, and the light-emitting distribution extends from the maximum light-emitting position 13E to the second electrode 14, the correction amounts $a_1$ and $a_2$ are determined by, for example, Mathematical Formulas 8 and 9.

$$a_1 = b(\log_e(s)) \qquad \text{[Mathematical Formula 8]}$$

(where b is a value within a range of $2n \leqq b \leqq 6n$ in the case where the light-emitting distribution in the light-emitting layer 13C extends from the maximum light-emitting position 13E to the first electrode 12, or a value within a range of $-6n \leqq b \leqq -2n$ in the case where the light-emitting distribution in the light-emitting layer 13C extends from the maximum light-emitting position 13E to the second electrode 14, s represents a physical value (1/e decay distance) relating to the light-emitting distribution in the light-emitting layer 13C, and n is an average refractive index between the first end portion P1 and the second end portion P2 in the peak wavelength λ of the spectrum of light desired to be extracted.)

$$a_2 = -a_1 \qquad \text{[Mathematical Formula 9]}$$

The physical value s in Mathematical Formula 8 is given by the light-emitting distribution in the light-emitting layer 13C, that is, Mathematical Formula 10 which represents light-emitting intensity I in a position at a distance x away from an interface of the light-emitting layer 13C to become the maximum light-emitting position 13E in a direction to the other interface of the light-emitting layer 13C. The light-emitting distribution varies depending upon a factor such as the light-emitting layer 13C, a charge balance or the like, thereby the physical value s varies. For example, when the organic light-emitting devices 10R, 10G and 10B are made of the above-described materials, in the organic light-emitting device 10R, the value of s on the side closer to the second electrode 14 is from 15 nm to 35 nm, and the value of s on the side closer to the first electrode 12 is from 2 nm to 10 nm, in the organic light-emitting device 10G, the value of s on the side closer to the first electrode 12 is from 15 nm to 30 nm, and in the organic light-emitting device 10B, the value of s on the side closer to the first electrode 12 is from 10 nm to 25 nm. The physical value s can be obtained by actual measurement.

$$I = e^{(-x/s)} \qquad \text{[Mathematical Formula 10]}$$

Figure 5:
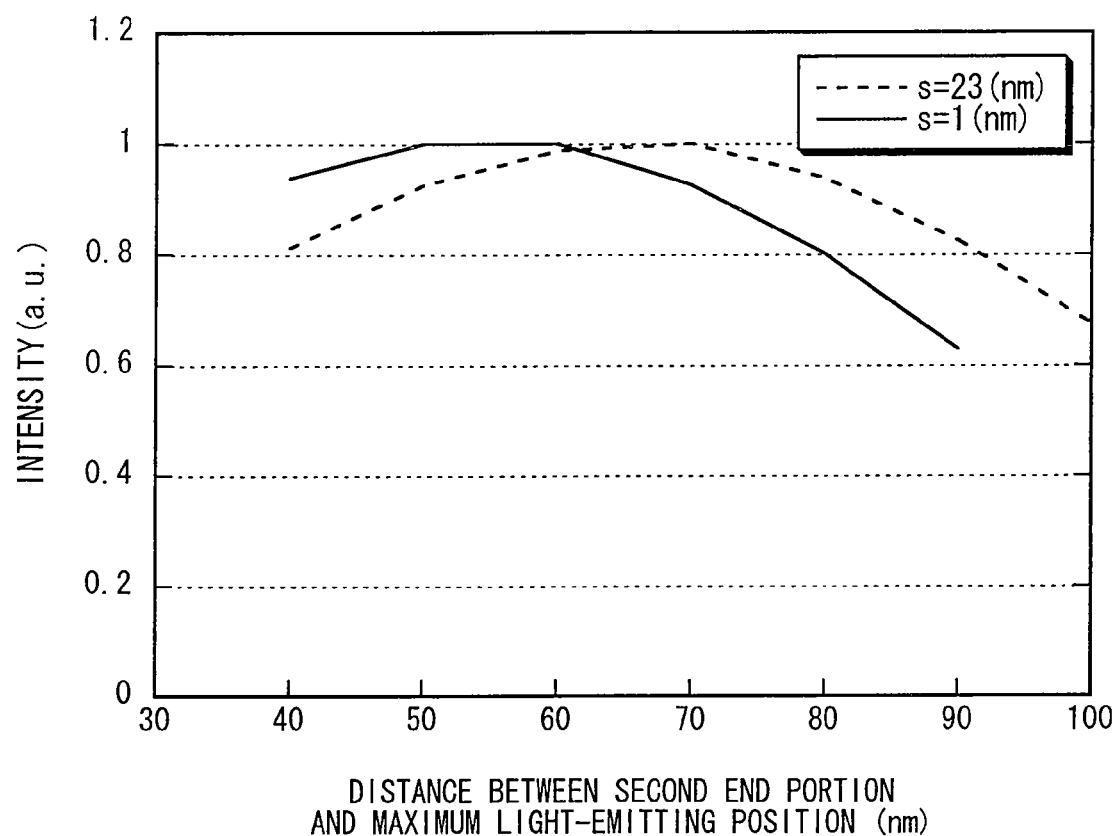
FIG. 5 is a graph showing simulation results for intensity at different distances between a second end portion and a maximum light-emitting position.

FIG. 5 shows simulation results for intensity at different distances between the second end portion P2 and the maximum light-emitting portion 13E under the condition that Mathematical Formula 5 holds true. The organic light-emitting device has a structure in which the first electrode 12 made of chromium, the hole transport layer 13B made of α-NPD, the light-emitting layer 13C made of $Alq_3$ mixed with Coumarin6, the electron transport layer 13D made of $Alq_3$, and the second electrode 14 made of a MgAg alloy are laminated in this order, and the peak wavelength λ of the spectrum of light desired to be extracted is 535 nm. In this case, the phase shift $\Phi_1$ of reflected light generated in the first end portion P1 is −2.6 rad, and the phase shift $\Phi_2$ of reflected light generated in the second end portion P2 is −2.2 rad. Further, the maximum light-emitting position 13E is an interface between the light-emitting layer 13C and the hole transport layer 13B.

As shown in FIG. 5, in the case where s=1 nm, that is, the light-emitting region is not extended, the intensity is maximized at a distance between the second end portion P2 and the maximum light-emitting position 13E of approximately 53 nm, that is, at an optical distance $L_2$ of approximately 53 n (nm). The optical distance $L_2$ is in agreement with the theoretical optical distance $tL_2$ between the second end portion P2 and the maximum light-emitting position 13E of 53 n (nm) determined by Mathematical Formula 7. However, in the case where s=23 nm, that is, the light-emitting region is extended, the intensity is maximized at an optical distance $L_2$ of approximately 67 n (nm). Accordingly, it is obvious that a correction based upon the light-emitting distribution is required.

Figure 6:
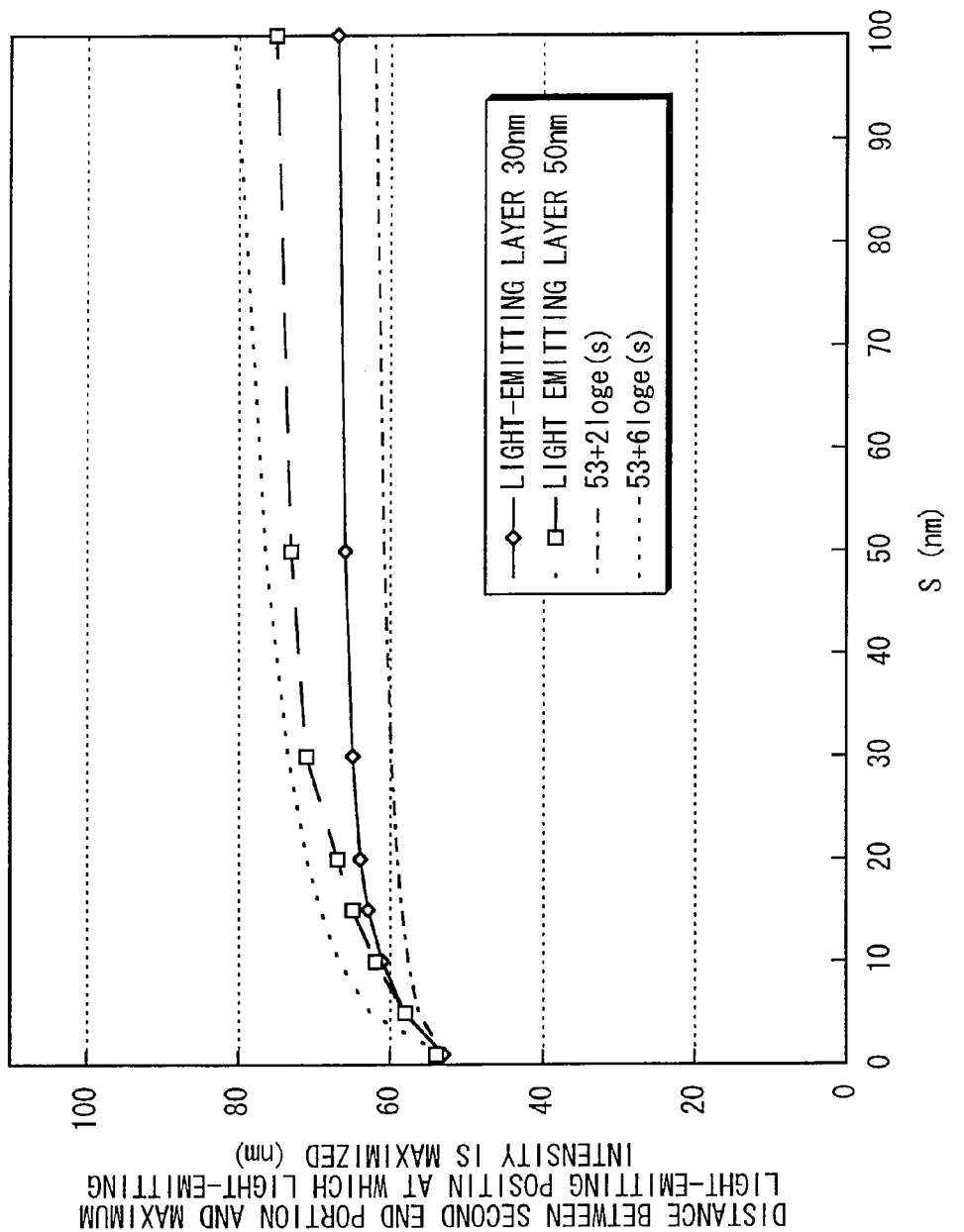
FIG. 6 is a graph showing a relationship between the value of s and a distance between the second end portion and the maximum light-emitting position at which light-emitting intensity is maximized in cases where the light-emitting layer has a thickness of 30 nm and 50 nm.

FIG. 6 shows a relationship between the value of s and a distance between the second end portion P2 and the maximum light-emitting position 13E at which the light-emitting intensity maximized under the condition that Mathematical Formula 5 holds true in the cases where the light-emitting layer 13C has a thickness of 30 nm and 50 nm. The structure of the organic light-emitting device and the peak wavelength λ of the spectrum of light desired to be extracted are the same as in the case shown in FIG. 5. Further, in FIG. 6, values of a minimum value or a maximum value of the correction amount $a_2$ determined by Mathematical Formulas 8 and 9 added to the theoretical optical distance $tL_2$ determined by Mathematical Formula 7, that is, $(53+2 \log_e(s))n$ and $(53+6 \log_e(s))n$ are also shown.

As shown in FIG. 6, as the value of s increases, the distance between the second end portion P2 and the maximum light-emitting position 13E at which the light-emitting intensity is maximized increases, and approaches a certain value by the thickness of the light-emitting layer 13C. In the cases where a curve approximates to an approximation expression $tL_2+b$ $(\log_e(s))$, and the light-emitting layer 13C has a thickness of 30 nm and 50 nm, the distance between the second end portion P2 and the maximum light-emitting position 13E at which the light-emitting intensity is maximized is positioned between $53+2 \log_e(s)$ and $53+6 \log_e(s)$. The thickness of the light-emitting layer 13C is generally within a range of 30 nm to 50 nm, so as shown in Mathematical Formulas 8 and 9, it is found out that the optical distance $L_2$ is preferably within a range of $tL_2+2\log_e(s)n$ to $tL_2+5\log_e(s)n$. In addition, the case where the light-emitting distribution in the light-emitting layer 13C extends from the maximum light-emitting position 13E to the first electrode 12 is the same as in the case where the light-emitting distribution in the light-emitting layer 13C extends from the maximum light-emitting position 13E to the second electrode 14, except that the sign of b in the above approximation expression is opposite.

Thus, as a specific structure of the organic light-emitting device 10R satisfying Mathematical Formulas 5 through 9, for example, in the case where the peak wavelength λ of the spectrum of light desired to be extracted is 635 nm, a structure in which the first electrode 12 made of chromium, the hole injection layer 13A made of 2-TNATA with a thickness of 32 nm, the hole transport layer 13B made of the compound shown in FIG. 3 with a thickness of 37 nm, the light-emitting layer 13C made of $Alq_3$ mixed with 40 vol % of BSN-BCN with a thickness of 25 nm, the electron transport layer 13D made of $Alq_3$ with a thickness of 48 nm, and the second electrode 14 made of a MgAg alloy with a thickness of 12 nm are laminated in order is cited. In this case, s is 30 nm.

Moreover, as another specific structure of the organic light-emitting device 10R, for example, in the case where the peak wavelength λ of the spectrum of light desired to be extracted is 635 nm, a structure in which the first electrode 12 made of a AgPdCu alloy, the hole injection layer 13A made of 2-TNATA with a thickness of 18 nm, the hole transport layer 13B made of the compound shown in FIG. 3 with a thickness of 37 nm, the light-emitting layer 13C made of $Alq_3$ mixed with 40 vol % of the BSN-BCN with a thickness of 25 nm, the electron transport layer 13D made of $Alq_3$ with a thickness of 48 nm, and the second electrode 14 made of a MgAg alloy with a thickness of 12 nm are laminated in order is cited. In this case, s is 30 nm.

As a specific structure of the organic light-emitting device 10G satisfying Mathematical Formulas 5 through 9, for example, in the case where the peak wavelength λ of the spectrum of light desired to be extracted is 535 nm, a structure in which the first electrode 12 made of chromium, the hole transport layer 13B made of the compound shown in FIG. 3 with a thickness of 55 nm, the light-emitting layer 13C made of $Alq_3$ mixed with 3 vol % of Coumarin6 with a thickness of 30 nm, the electron transport layer 13D made of $Alq_3$ with a thickness of 33 nm, and the second electrode 14 made of a MgAg alloy with a thickness of 12 nm are laminated in order is cited. In this case, $\Phi$ is −4.8 rad, L is 117 n (nm), $\Phi_1$ is −2.6 rad, $tL_1$ is 64 n (nm), $L_1$ is 50 n (nm), s is 23 nm, $\Phi_2$ is −2.2 rad, $tL_2$ is 53 n (nm), $L_2$ is 67 n (nm), the average refractive index n between the first end portion P1 and the second end portion P2, that is, the average refractive index n of the organic layer 13 is 1.7.

Moreover, as another specific structure of the organic light-emitting device 10G, for example, in the case where the peak wavelength λ of the spectrum of light desired to be extracted is 535 nm, a structure in which the first electrode 12 made of a AgPdCu alloy, the hole transport layer 13B made of the compound shown in FIG. 3 with a thickness of 39 nm, the light-emitting layer 13C made of $Alq_3$ mixed with 3 vol % of Coumarin6 with a thickness of 30 nm, the electron transport layer 13D made of $Alq_3$ with a thickness of 33 nm, and the second electrode 14 made of a MgAg alloy with a thickness of 12 nm are laminated in order is cited. In this case, s is 23 nm.

As a specific structure of the organic light-emitting device 10B satisfying Mathematical Formulas 5 through 9, as in the case where the peak wavelength λ of the spectrum of light desired to be extracted is 450 nm, a structure in which the first electrode 12 made of chromium, the hole transport layer 13B made of the compound shown in FIG. 3 with a thickness of 36 nm, the light emitting-layer 13C made of spiro6Φ with a thickness of 34 nm, the electron transport layer 13D made of $Alq_3$ with a thickness of 12 nm, and the second electrode 14 made of a MgAg alloy with a thickness of 12 nm are laminated in order is cited.

Moreover as another specific structure of the organic light-emitting device 10B, for example, in the case where the peak wavelength λ of the spectrum of light desired to be extracted is 450 nm, a structure in which the first electrode 12 made of a AgPdCu alloy, the hole transport layer 13B made of the compound shown in FIG. 3 with a thickness of 20 nm, the light-emitting layer 13C made of spiro6Φ with a thickness of 34 nm, the electron transport layer 13D made of $Alq_3$ with a thickness of 12 nm, and the second electrode 14 made of a MgAg alloy with a thickness of 12 nm are laminated in order is cited.

The sealing panel 20 shown in FIG. 1 is placed on a side of the drive panel 10 closer to the second electrode 14, and has a sealing substrate 21 which seals the organic light-emitting devices 10R, 10G and 10B with the adhesive layer 30. The sealing substrate 21 is made of a material transparent to light generated in the organic light-emitting devices 10R, 10G and 10B such as glass or the like. For example, a color filter 22 is disposed on the sealing substrate 21 to extract light generated in the organic light-emitting devices 10R, 10G and 10B, and to absorb external light reflected on the organic light-emitting devices 10R, 10G and 10B and wiring therebetween, thereby the contrast is improved.

The color filter 22 may be disposed on either side of the sealing substrate 21, but the color filter 22 is preferably disposed on a side closer to the drive panel 10, because the color filter 22 is not exposed to the surface, and can be protected by the adhesive layer 30. The color filter 22 includes a red filter 22R, a green filter 22G and a blue filter 22B, which are disposed corresponding to the organic light-emitting devices 10R, 10G and 10B, respectively.

The red filter 22R, the green filter 22G and the blue filter 22B each have, for example, a rectangular shape, and are formed with no space in between. The red filter 22R, the green filter 22G and the blue filter 22B each are made of a resin mixed with pigments, and by the selection of the pigments, the light transmittance in a targeted wavelength of red, green or blue is adjusted to be higher, and the light transmittance in the other wavelengths is adjusted to be lower.

Moreover, a wavelength range with high transmittance in the color filter 22 matches the peak wavelength λ of the spectrum of light desired to be extracted from the resonator structure. Thereby, among external light incident from the sealing panel 20, only light having a wavelength equivalent to the peak wavelength λ of the spectrum of light to be extracted passes through the color filter 22, and external light with other wavelengths can be prevented from entering into the organic light-emitting devices 10R, 10G and 10B.

The organic light-emitting devices 10R, 10G and 10B can be manufactured through, for example, the following steps.

Figure 7A:
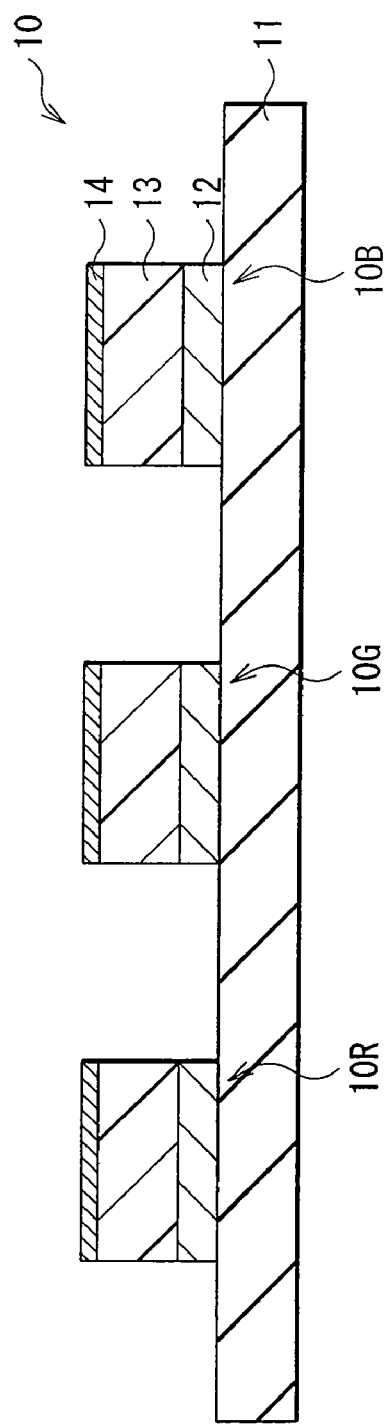
FIGS. 7A and 7B are sectional views showing a step in a method of manufacturing the display unit shown in FIG. 1.

FIGS. 7A, 7B, 8A and 8B show a method of manufacturing the display unit step by step. At first, as shown in FIG. 7A, the first electrode 12 made of the above-described material with the above-described thickness is formed on the driving substrate 11 made of the above-described material through, for example, direct current sputtering, and is selectively etched by using, for example, a lithography technique to be patterned into a predetermined shape. After that, as shown in FIG. 7A, the hole injection layer 13A, the hole transport layer 13B, the light-emitting layer 13C, the electron transport layer 13D and the second electrode 14 each of which is made of the above-described material with the above-described thickness are formed in order through, for example, vapor deposition to form the organic light-emitting devices 10R, 10G and 10B shown in FIGS. 2 and 4. Thereby, the drive panel 10 is formed.

Figure 7B:
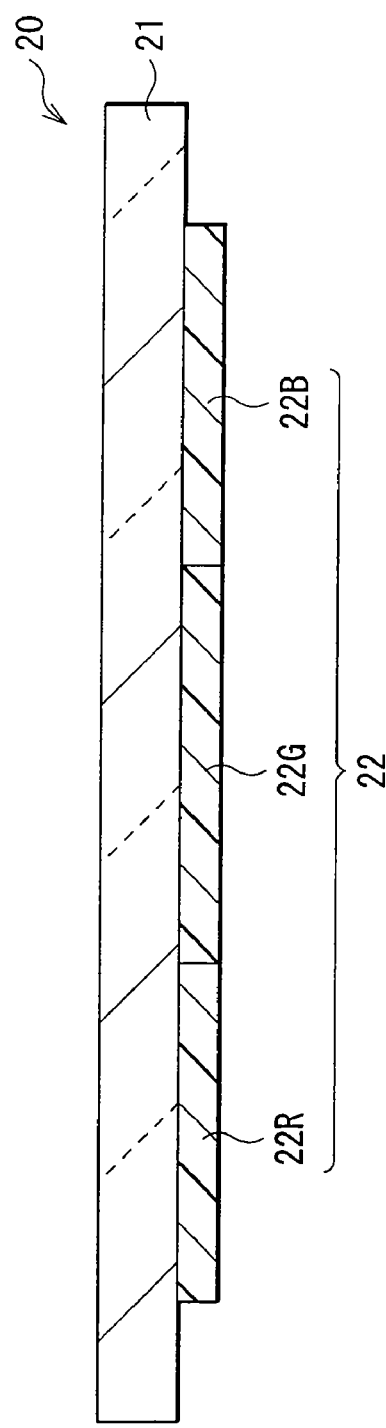

As shown in FIG. 7B, for example, the sealing substrate 21 made of the above-described material is coated with the material of the red filter 22 through a spin coat method or the like, and the material is patterned through a photolithography technique and fired to form the red filter 22R. Then, as shown in FIG. 7B, as in the case of the red filter 22R, the blue filter 22B and the green filter 22G are formed in order. Thereby, the sealing panel 20 is formed.

Figure 8A:
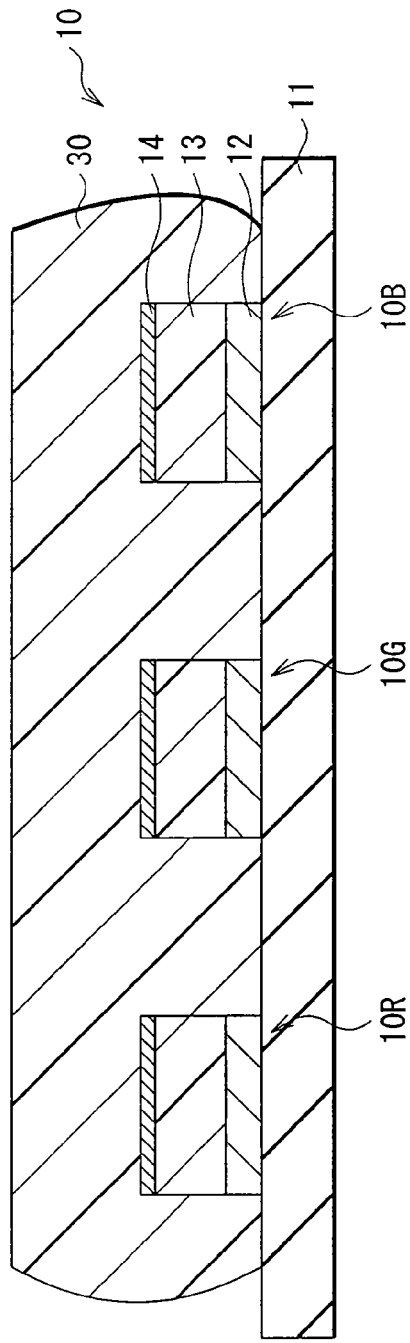
FIGS. 8A and 8B are sectional views showing a step following the step in FIGS. 7A and 7B.
Figure 8B:
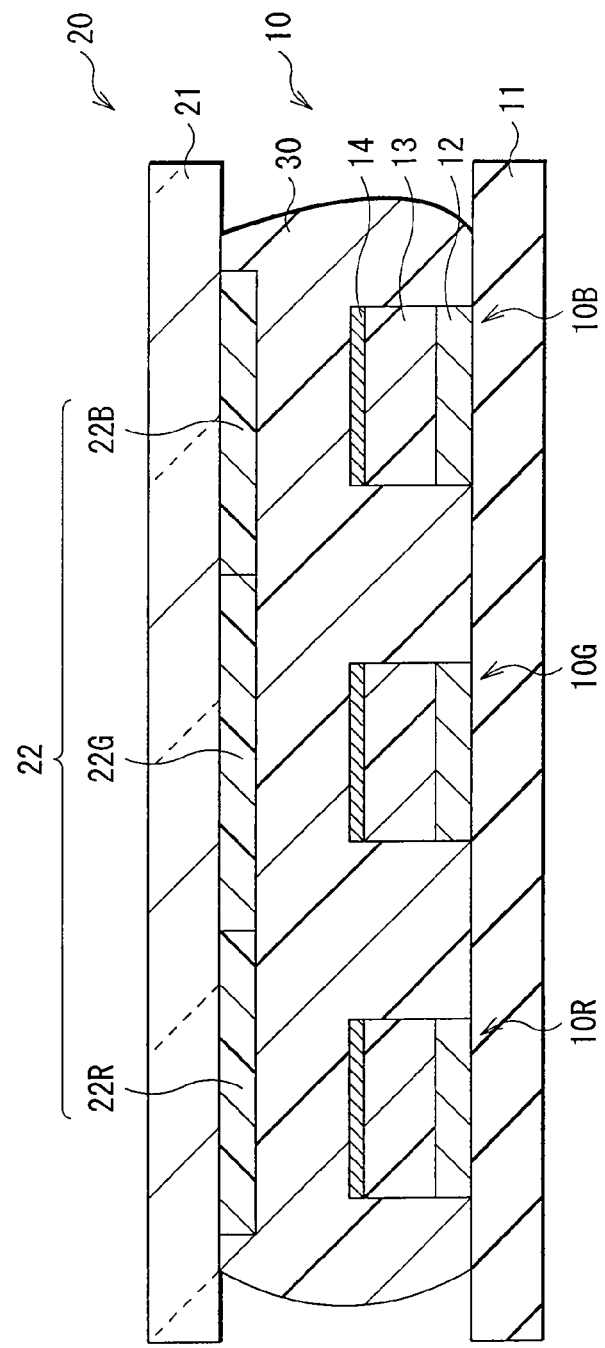

After the sealing panel 20 and the drive panel 10 are formed, as shown in FIG. 8A, the adhesive layer 30 is formed on organic light-emitting devices 10R, 10G and 10B. After that, as shown in FIG. 8B, the drive panel 10 and the sealing panel 20 are bonded together with the adhesive layer 30 in between. At this time, it is preferable that a surface of the sealing panel 20 on a side where the color filter 22 is formed is disposed so as to face the drive panel 10. Thus, the drive panel 10 and the sealing panel 20 are bonded together to complete the display unit shown in FIGS. 1 through 4.

In the display unit, when a predetermined voltage is applied between the first electrode 12 and the second electrode 14, a current is injected into the light-emitting layer 13B, and holes and electrons are recombined to emit light. The light is reflected several times between the first electrode 12 and the second electrode 14, and then passes through the second electrode 14, the color filter 22 and the sealing substrate 21 to be extracted. At this time, the optical distance $L_1$ between the maximum light-emitting position 13E and the first end portion P1 satisfies Mathematical Formula 6, so when light heading to the first electrode 12 in the emitted light is reflected on the first end portion P1 and is returned, the phase of the returned light becomes the same as the phase of light heading to the second electrode 14 in the emitted light, thereby the returned light and the light heading to the second electrode 14 reinforce each other. Moreover, the optical distance $L_2$ between the maximum light-emitting position 13E and the second end portion P2 satisfies Mathematical Formula 7, so when light heading to the second electrode 14 in the emitted light is reflected on the second end portion P2 and is returned, the phase of the retuned light becomes the same as the phase of light heading to the first electrode 12 in the emitted light, thereby the returned light and the light heading to the first electrode 12 reinforce each other. Therefore, the light generated in the light-emitting layer 13C can be efficiently extracted.

Thus, in the embodiment, the optical distance $L_1$ between the maximum light-emitting position 13E and the first end portion P1 satisfies Mathematical Formula 6, and the optical distance $L_2$ between the maximum light-emitting position 13E and the second end portion P2 satisfies Mathematical Formula 7, so the phase of light generated in the light-emitting layer 13C and the phase of returned light which is reflected on the first end portion P1 or the second end portion P2 and is returned to the light-emitting position can become the same. Therefore, light reflected between the first end portion P1 and the second end portion P2 and emitted light can reinforce each other, and the extraction efficiency of light generated in the light-emitting layer 13C can be improved.

Second Embodiment

Figure 9:
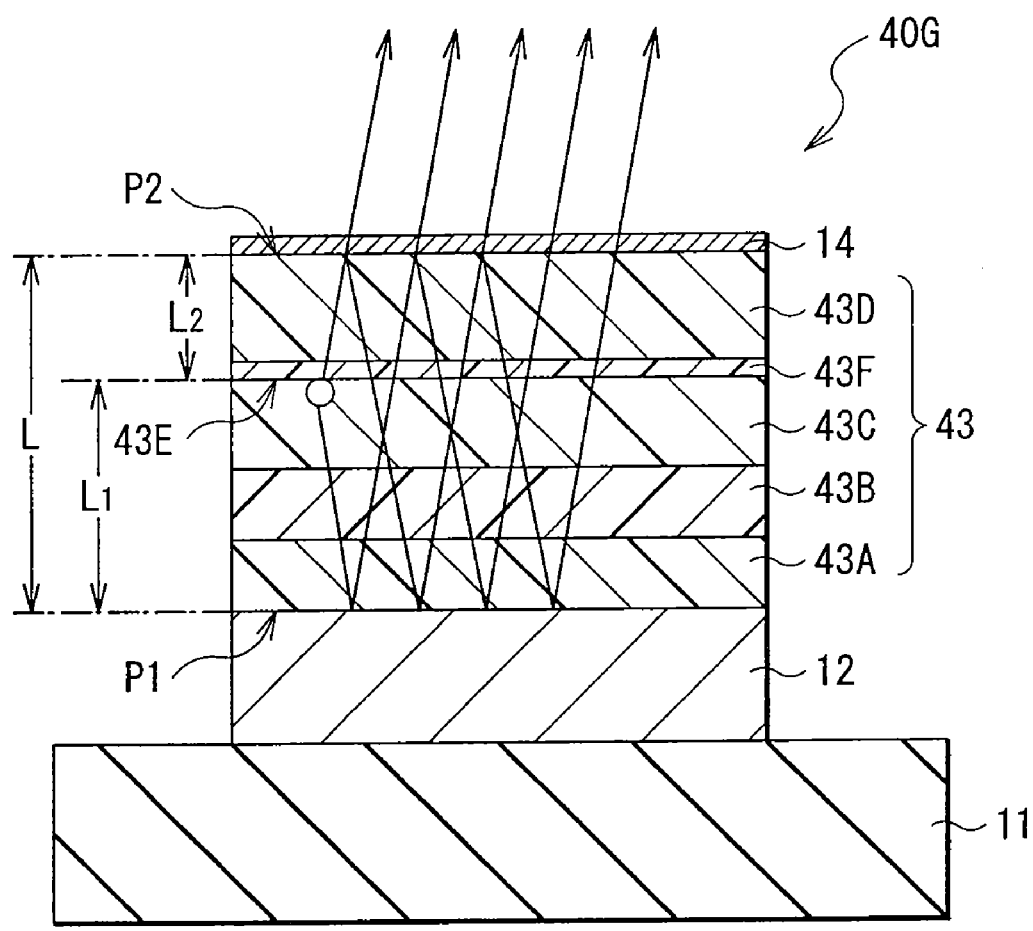
FIG. 9 is an enlarged sectional view of an organic layer in an organic light-emitting device used in a display unit according to a second embodiment of the invention.

Next, a display unit according to a second embodiment of the invention will be described below. The display unit is equivalent to the display unit according to the first embodiment shown in FIG. 1, except that the display unit according to the second embodiment comprises an organic light-emitting device 40G including an organic layer 43 with a structure shown in FIG. 9 instead of the organic light-emitting device 10G of the display unit according to the first embodiment. The display unit according to the second embodiment can be manufactured, act, and provide effects as in the case of the first embodiment. Therefore, like components are denoted by like numerals as of the first embodiment and will not be further explained.

The organic light-emitting device 40G is a so-called green phosphorescence device, and mainly emits light at an interface of the light-emitting layer 43C on a side closer to the second electrode 14. Namely, a maximum light-emitting position 43E is the interface of the light-emitting layer 43C on the side closer to the second electrode 14. Moreover, the organic light-emitting device 40G has the same structure as the organic light-emitting device 10G, except that the organic layer 43 has a different structure. The organic layer 43 has a structure in which, for example, a hole injection layer 43A made of 2-TNATA, a hole transport layer 43B made of the compound shown in FIG. 3, a light-emitting layer 43C made of 4,4'-bis(carbazole-9-yl)biphenyl (CBP) mixed with 5 vol % of tris[2-(2-pyridinyl)phenyl-C,N]-iridium (Irppy), a hole block layer 43F made of bis(2-methyl-8-quinolinolato)(p-phenylphenolato)aluminum (III) (BAlq), and an electron transport layer 43D made of $Alq_3$ are laminated in order from the first electrode 12.

The optical distance L between the first end portion P1 and the second end portion P2 of the resonator, the optical distance $L_1$ between the maximum light-emitting position 43E and the first end portion P1, and the optical distance $L_2$ between the maximum light-emitting position 43E and the second end portion P2 preferably satisfy Mathematical Formulas 5 through 9 as in the case of the first embodiment.

As a specific structure satisfying Mathematical Formulas 5 through 9, for example, in the case where the organic layer 43 is made of the above-described materials, and the peak wavelength λ of the spectrum of light desired to be extracted is 520 nm, a structure including the hole injection layer 43A with a thickness of 15 nm, the hole transport layer 43B with a thickness of 25 nm, the light-emitting layer 43C with a thickness of 30 nm, the hole block layer 43F with a thickness of 10 nm, the electron transport layer 43D with a thickness of 40 nm, the first electrode 12 made of chromium, and the second electrode 14 made of a MgAg alloy with a thickness of 12 nm is cited.

Although the present invention is described referring to the preferred embodiments, the invention is not limited to the embodiments, and is variously modified. For example, the materials and the thicknesses of the layers, film forming methods, film forming conditions and so on are not limited to those described in the embodiments, and any other materials, any other thicknesses, any other film forming methods and any other film forming conditions may be applicable. For example, in the above embodiments, the case where the first electrode 12, the organic layer 13 and the second electrode 14 are formed on the driving substrate 11 in order, and light is extracted from the sealing panel 20 is described, but they may be formed in reverse order, that is, the second electrode 14, the organic layer 13 and the first electrode 12 may be formed on the driving substrate 11 in order, thereby light can be extracted from the driving substrate 11.

Moreover, for example, in the embodiments, the case where the first electrode is an anode, and the second electrode 14 is a cathode is described, but the first electrode 12 may be a cathode, and the second electrode 14 may be an anode. Further, while the first electrode 12 is the cathode and the second electrode 14 is the anode, the second electrode 14, the organic layer 13 and the first electrode 12 can be formed on the driving substrate 11 in order so as to extract light from the driving substrate 11.

In the above embodiments, the specific structures of the organic light-emitting devices 10R, 10G and 10B are described, but it is not necessary for the organic light-emitting devices 10R, 10G and 10B to have all layers, or the organic light-emitting devices 10R, 10G and 10B may further have some other layer. For example, a thin film layer for hole injection made of chrominum oxide (III) ($Cr_2O_3$), ITO (indium-tin oxide: a mixed oxide film including indium (In) and tin (Sn)) may be included between the first electrode 12 and the organic layer 13. The organic light-emitting devices 10R, 10G and 10B may be covered with a protective film, and the adhesive layer 30 may be formed on the protective film. Further, for example, the first electrode 12 can have a two-layer structure in which a transparent conductive film is formed on a top portion of a reflective film such as a dielectric multilayer film, Al or the like. In this case, an end surface of the reflective film on a side closer to the light-emitting layer constitutes an end portion of the resonant portion, and the transparent conductive film constitutes a part of the resonant portion.

Moreover, in the above embodiments, the case where the second electrode 14 is made of a semi-transparent reflective layer is described, but the second electrode 14 may have a structure in which a semi-transparent reflective layer and a transparent electrode are laminated in order from the first electrode 12. The transparent electrode reduces the electrical resistance of the semi-transparent reflective layer, and is made of an electrically conductive material having sufficient translucency to light generated in the light-emitting layer. As the material of the transparent electrode, for example, ITO or a compound including indium, zinc (Zn) and oxygen is preferable, because the compound can obtain good electrical conductivity even if film formation is carried out at room temperature. The transparent electrode can have, for example, a thickness of 30 nm to 1000 nm. In this case, a resonator structure in which the semi-transparent reflective layer is an end portion, and the other end portion is disposed in a position facing the semi-transparent electrode with the transparent electrode in between so that the transparent electrode becomes a resonant portion may be formed. Further, it is preferable that while such a resonator structure is formed, the organic light-emitting devices 10R, 10G and 10B are covered with a protective film made of a material having a refractive index equivalent to the material of the transparent electrode, because the protective film can constitute a part of the resonant portion.

The invention is applicable to a resonator structure in which the second electrode 14 is made of the transparent electrode, and an end surface of the transparent electrode on a side opposite to the organic layer 13 has high reflectance, and an end surface of the first electrode 12 on a side closer to the light-emitting layer 13B is the first end portion, and an end surface of the transparent electrode on a side opposite to the organic layer 13 is the second end portion. For example, the transparent electrode may contact with an atmospheric layer so as to increase the reflectance of an interface surface between the transparent electrode and the atmospheric layer, thereby the interface surface may be the second end portion. Further, the reflectance of an interface surface with the adhesive layer may be increased, thereby the interface may be the second end portion. The organic light-emitting devices 10R, 10G and 10B may be covered with a protective film, and the reflectance of an interface surface with the protective film may be increased, thereby the interface surface may be the second end portion.

As described above, in the display device according to the invention or the display unit according to the invention, the optical distance $L_1$ between the first end portion and the maximum light-emitting position satisfies Mathematical Formula 1 or mathematical Formula 3, and the optical distance $L_2$ between the second end portion and the maximum light-emitting position satisfies Mathematical Formula 2 or Mathematical Formula 4, so the phase of light generated in the light-emitting layer and the phase of returned light which is reflected on the first end portion or the second end portion and is returned to the light-emitting position can be the same as each other. Therefore, light reflected between the first end portion and the second end portion and generated light can reinforce each other, and the extraction efficiency of light generated in the light-emitting layer can be improved.

Obviously many modifications and variations of the present invention are possible in the light of the above teachings. It is therefore to be understood that within the scope of the appended claims the invention may be practiced otherwise than as specifically described.

What is claimed is:

1. A method for manufacturing a display unit comprising the steps of:

providing a drive panel including a driving substrate, a first electrode having a first end portion, an organic layer having at least a light-emitting layer, and a second electrode having a second end portion, the light generated in the light-emitting layer being resonated between the first end portion and the second end portion; and providing a sealing panel bonded to the drive panel with an adhesive layer therebetween, wherein an optical distance $L_1$ between the first end portion and a maximum light-emitting position of the light-emitting layer satisfies Mathematical Formula 1, $$L_1 = tL_1 + a_1, \quad \text{(Mathematical Formula 1)}$$

where $(2tL_1)/\lambda = -\Phi_1/(2\pi) + m_1$, and where $tL_1$ represents an optical distance between the first end portion and the maximum light-emitting position, $a_1$ represents a correction amount based upon a light-emitting distribution in the light-emitting layer, $\lambda$ represents a peak wavelength of the spectrum of light desired to be extracted, $\Phi_1$ represents a phase shift of reflected light generated in the first end portion, and $m_1$ is 0 or an integer, wherein an optical distance $L_2$ between the second end portion and the maximum light-emitting position of the light-emitting layer satisfies Mathematical Formula 2, $$L_2 = tL_2 + a_2, \quad \text{(Mathematical Formula 2)}$$

where $(2tL_2)/\lambda = -\Phi_2/(2\pi) + m_2$, and where $tL_2$ represents an optical distance between the second end portion and the maximum light-emitting position, $a_2$ represents a correction amount based upon a light-emitting distribution in the light-emitting layer, $\lambda$ represents a peak wavelength of the spectrum of light desired to be extracted, $\Phi_2$ represents a phase shift of reflected light generated in the second end portion, and $m_2$ is 0 or an integer, wherein a distance L between the first end portion and the second end portion equals the sum of the distance $L_1$ and the distance $L_2$, wherein the correction amount $a_1$ satisfies Mathematical Formula 3, $$a_1 = b(\log_e(s)), \quad \text{(Mathematical Formula 3)}$$

where b is a value within a range of $2n \leq b \leq 6n$ in the case where the light-emitting distribution in the light-emitting layer extends from the maximum light-emitting position to the first electrode, or a value within a range of $-6n \leq b \leq -2n$ in the case where the light emitting distribution extends from the maximum light-emitting position to the second electrode, s represents a physical value (1/e decay distance) relating to the light-emitting distribution in the light-emitting layer, n is an average refractive index between the first end portion and the second end portion in the peak wavelength $\lambda$ of the spectrum of light desired to be extracted, and wherein the correction amount $a_2$ satisfies Mathematical Formula 4, $$a_2 = -a_1 \quad \text{(Mathematical Formula 4).}$$

2. A method for manufacturing a display unit according to claim 1, wherein the sealing panel includes a color filter.

* * * * *